United States Patent
Jackson et al.

(10) Patent No.: US 6,339,012 B1
(45) Date of Patent: Jan. 15, 2002

(54) METHOD OF FABRICATING A SEMICONDUCTING THIN FILM OF POLYMER WITH IMPROVED CHAIN ORDERING BY DRYING IN SOLVENT RICH ATMOSPHERE

(76) Inventors: Thomas Jackson, 1348 Deerfield Dr., State College, PA (US) 16801; Jianna Wang, 5 Dolores Ave., #8, Waltham, MA (US) 02452

( * ) Notice: Subject to any disclaimer, the term of this patent is extended or adjusted under 35 U.S.C. 154(b) by 0 days.

(21) Appl. No.: 09/450,991

(22) Filed: Nov. 29, 1999

(51) Int. Cl.[7] .......................... H01L 21/20; H01L 21/36
(52) U.S. Cl. .................. 438/478; 438/149; 438/479; 427/335; 427/430.1; 427/443.2
(58) Field of Search .................. 438/149, 478, 438/479; 427/581, 335, 430.1, 443.2

(56) References Cited

U.S. PATENT DOCUMENTS 3,557,749 A  *  1/1971  Farago ........................ 118/7

OTHER PUBLICATIONS

George, Preparation of Thin Films, Chapter 7, pp. 311–313 & 332.

Gibson et al, Dip–Coating Method for Fabricating Thin Photoresist Films, Thin Solid Films, 128 (1985) 161–170.*

* cited by examiner

*Primary Examiner*—Matthew Smith
*Assistant Examiner*—Craig P. Lytle
(74) *Attorney, Agent, or Firm*—Birch, Stewart, Kolasch & Birch, LLP.

(57) ABSTRACT

In a method for fabricating a thin film of polymer, particularly a semiconducting thin film of polymer with an improved structural order, wherein the thin film is formed by deposition of a polymer material onto a solid substrate material from a polymer solution formed by means of a solvent, the polymer solution is provided in a closed container such that a free volume is left in the container above the polymer solution and the substrate material immersed in the solution, whereupon the substrate material with a thin film deposited thereon is withdrawn from the polymer solution with a withdrawal speed being selected dependent on the concentration of the polymer solution, until the substrate material is located in the free volume a certain distance above the polymer solution. The substrate material is kept in vertical position in the free volume while the solvent evaporates, whereupon the substrate material with the thin film is removed from the container for further drying in a vacuum oven.—Use in fabrication of organic thin-film transistors.

5 Claims, 2 Drawing Sheets

METHOD OF FABRICATING A SEMICONDUCTING THIN FILM OF POLYMER WITH IMPROVED CHAIN ORDERING BY DRYING IN SOLVENT RICH ATMOSPHERE

FIELD OF THE INVENTION

The present invention concerns a method for fabricating a thin film of polymer, particularly a semiconducting thin film of polymer with an improved structural order, wherein the thin film is formed by deposition of a polymer material onto a solid substrate material, from a polymer solution formed by means of a solvent.

BACKGROUND OF THE INVENTION

It is well-known to persons skilled in the art that liquid phase epitaxy offers a fast and simple method for fabricating high purity films and semiconductor compounds and alloys. In principle liquid phase epitaxy concerns growing a crystalline layer of a material on a crystalline substrate. The layer is grown from a solution or melt of material by the substrate being dipped in or brought into contact with the solution or melt. For liquid phase epitaxy there is in Joy George, "Preparation of thin films", Section 7.2 pp. 311–312 disclosed a so-called dip-coating method where a vertical system is used (see FIG. 7.3), as proposed by H. Ruprecht, "Gallium Arsenide" Institute of Physics conference, Vol.3, p. 57, (J. Frankel Editor, Bristol Institute of Physics (1967)). The melt or solution is here provided in a crucible in a vertical column and the substrate immersed into the solution and withdrawn vertically from it. Both immersion and withdrawal take place under specific temperature conditions. The vertical column is open in the sense that it during the process is flushed by a reducing gas or a gas with a reduction agent in order to prevent oxidation of the thin film.

In the present invention the subject is, however, not liquid phase epitaxy, but an ordinary deposition of a thin film from a polymer solution and it is therefore in no way evident that the system as the above-mentioned for liquid phase epitaxy, straightforwardly may be applied in the method according to the present invention.

The adsorption of polymer materials from a solution onto a solid substrate has been studied both theoretically and experimentally and in that connection reference shall be made to the following publications, viz. A. Silberberg, Discuss. Faraday Soc., 59: 203 (1976); W. H. Grant, L. E. Smith and R. R. Stromberg, Discuss. Faraday Soc., 50: 209 (1976); Y. Cohen and S. Reich, "Ordering Phenomena in Thin Polystyrene Films", Journal of Polymer Science: Polymer Physics Edition, 19: 599–608 (1981); and S. E. Rickert, C. M. Balik and A. J. Hoopfinger, "Organization and Assembly of Macromolecules on Inorganic Substrates", Advances in Colloid and Interface Science, 11: 149–191 (1979).

Silberberg (1976) and Grant & al. (1976) showed that adsorption of polystyrene on inorganic surfaces takes place in a two-step process. The first step consists in a rapid and simple segmental attachment. The second step consists in a molecular rearrangement, something which takes place very slowly. Completely adsorbed polymers can be regarded as many molecular segments packing on the surface.

FIGS. 1a–c show possible arrangements of polymer chains and particularly FIG. 1a shows an amorphous arrangement, FIG. 1b a semicrystalline arrangement and FIG. 1c a crystalline arrangement. According to Grant & al. (1976) these structures are present on the substrate due to a molecular reorientation after the adsorption. In order to improve the chain ordering it is important that the solvent which was used for forming the polymer solution is retained long enough to achieve molecular reorientation in the polymer material. In prior art solvent casting is a widely used method for fabricating photoresist thin films and this method is also used for fabricating organic thin-film devices of polymer. In the fabrication of organic thin-film transistors based on poly(3-hexyl thiophene) (P3HT), the active layer is for instance usually spin-coated from a solution of P3HT. During the spin coating the ordering of the polymer chain is, however, no longer possible because the solvent is not retained long enough to achieve chain ordering. Another disadvantage with solvent casting is that radial defects in the pattern very easily arise unless carefully selected spinning velocities are used. In Mauro Gibson and Jaime Frejlich. "Dip-coating method for fabricating thin photoresist films", Thin Solid Films, 128: 161–170 (1985) an investigation is presented of a dip-coating system for fabricating photoresist thin film and it was shown that it was possible to fabricate homogenous photoresist films with good repeatability. The dip-coating system according to Gibson & al. is, however, an "open" system, the container with the solution and the solvent being open to the atmosphere and possibly evaporated solvent will, of course, be leaking out.

SUMMARY OF THE INVENTION

The object of the present invention is hence to provide a method for fabricating thin films of polymer material on a solid substrate material such that the disadvantage with prior art and particular with the use of so-called "open" dip-coating systems are avoided. Further it is an object of the invention to be able to fabricate a very thin and homogenous thin film. Finally it is also an object to retain the solvent sufficiently long to obtain a chain ordering in the deposited thin film.

The above-mentioned and other objects and advantages are achieved with a method according to the invention which is characterized by providing the polymer solution in a portion of a closed container such that a free volume is left in the container above the portion with said polymer solution, immersing the substrate material in said polymer solution, withdrawing said substrate material with a thin film deposited thereupon from said polymer solution with a withdrawal speed being selected dependent on the concentration of said polymer solution, until said substrate material is located in said free volume at a certain distance above said polymer solution, and keeping said substrate material in a vertical position in said free volume, while the solvent evaporates, whereafter said substrate material with said thin film is removed from said container for further drying in a vacuum oven.

According to the invention the thickness of the deposited thin film for a given concentration of the polymer solution is advantageously regulated by regulating the withdrawal speed, the thickness increasing with the concentration of the polymer solution and increasing withdrawal speed.

It is according to the invention also advantageous that the substrate is kept in the vertical position at a distance of 1 cm above the surface of the polymer solution.

Finally it is according to the invention advantageous that the substrate is kept in the vertical position for a time period, the duration of which being selected dependent on the thickness of the thin film and the solvent concentration in the free volume. Preferably the substrate with the deposited thin film is kept in the vertical position for 20–30 min.

BRIEF DESCRIPTION OF THE DRAWINGS

The invention shall now be discussed in more detail with reference to the accompanying drawing wherein.

DETAILED DESCRIPTION OF THE INVENTION

Figure 1A:
FIG. 1a shows an amorphous polymer chain, FIG. 1b a semicrystalline polymer chain, FIG. 1c a crystalline polymer chain, and FIG. 2 a diagram of a dip-coating system for realizing the method according to the invention.
Figure 1B:
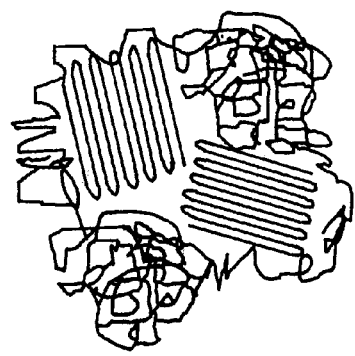
Figure 1C:
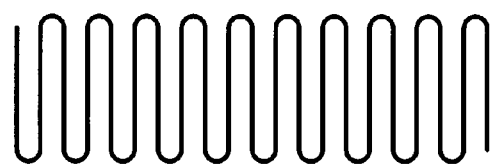

The method according to the present invention is realized by using a so-called semi-seal dip-coating system wherein the substrate, onto which the thin film is deposited, is slowly withdrawn from a polymer solution and thereafter being dried in a solvent-rich atmosphere. This is distinguished from the usual "open" dip-coating system wherein the whole system is exposed to the surrounding atmosphere. By using a slow withdrawal in the method according to the present invention, a very thin and homogenous thin film can be formed. The solvent-rich environment which is obtained in the closed container causes the solvent to be retained long enough for a chain ordering to occur. In this connection reference is made to FIGS. 1a–c which show schematic diagrams of the possible arrangements of polymer chains. Specifically FIG. 1a here shows an amorphous polymer chain, i.e. the lowest degree of ordering. FIG. 1b a semicrystalline polymer chain in the form of a so-called "fringed" micelle and finally FIG. 1c a crystalline or folded polymer chain.

Figure 2:
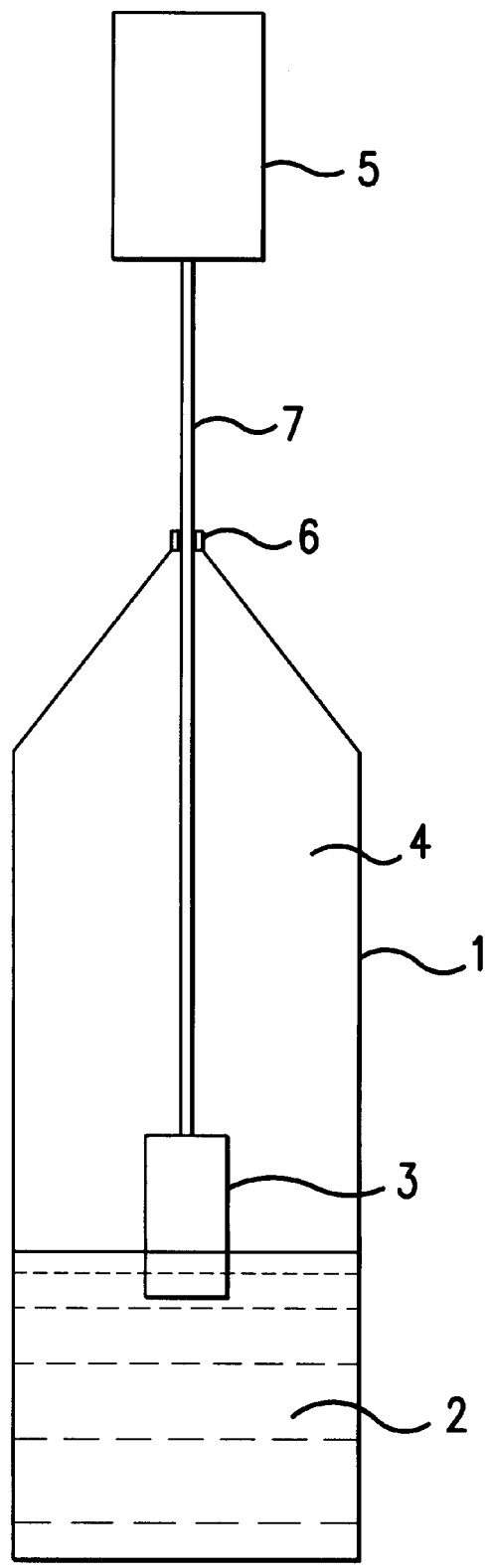

The dip-coating system proper is shown in FIG. 2. A polymer material from which the thin film is to be made is formed as a solution 2 with a suitable solvent provided in a closed container 1. The polymer solution 2 occupies only a portion of the container volume, such that above this portion a free volume 4 is left, which, however, at least is semi-sealed to the environment (the atmosphere). In the container 1 there is further provided a substrate material 3 onto which the thin film of polymer material shall be deposited. The substrate material may for instance be attached to a metal rod 7 which can be moved up and down by means of a reversible engine 5 provided outside the container 1, the metal rod 7 being guided through for instance an opening 6 in the container and preferably a not shown seal inserted in this opening. The substrate material 3 is now immersed in the polymer solution 2 and thereafter withdrawn with a speed which depends on the solution concentration. If the solution has a fixed concentration, the deposited thin film will be thicker the higher the withdrawal speed. A desired thickness of the thin film will hence be obtained by optimizing both the concentration and the withdrawal speed according to predetermined criteria. The thickness of the deposited thin film depends both on the withdrawal speed and the solution concentration. Generally one has $$t = kc\sqrt{\eta u} \qquad (1)$$

where t is the film thickness, k a constant, c the concentration of the polymer solution, $\eta$ the viscosity of the polymer solution and u the withdrawal speed.

After withdrawal from the polymer solution 2 the substrate material 3 with the deposited thin film is kept in vertical position in the free volume in the closed container 1 about one centimeter above the surface of the polymer solution 2. The solvent will now slowly evaporate and since the container 1 is closed, the evaporation will take place in a solvent-rich environment.

The holding time may be selected dependent of the film thickness, as given by the above equation and the solvent concentration in the free volume 4.

Preferably a holding time between 20 and 30 minutes is used, something which will be sufficient to achieve a satisfying or desired chain ordering. Thereafter the substrate material with the deposited thin film is removed from the container 1 and placed in a not shown vacuum oven for further drying.

A semi-sealed dip-coating system is easily integrated in a production line, for instance a three-roller system with dip trough.

By using the method according to the present invention organic thin-film transistors based on solvent cast poly(3-alkylthiophene) (P3AT) were fabricated. Experimental investigations showed that thin-film transistors with dip-coated active semiconductor layers had a far better field-effect mobility than thin-film transistors fabricated with spin-coated active semiconductor layers. This is mainly due to the fact that the dip-coated thin films of polymer had a far better ordering and longer conjugation length, something which improves the transport of the charge carriers.

What is claimed is:

1. A method for fabricating a thin film of polymer, particularly a semiconducting thin film of polymer with an improved structural order, wherein the thin film is formed by deposition of a polymer material onto a solid substrate material, from a polymer solution formed by means of a solvent, characterized by providing the polymer solution in a portion of a closed container, such that a free volume is left in the container above the portion with said polymer solution, immersing the substrate material in said polymer solution, withdrawing said substrate material with a thin film deposited thereupon, from said polymer solution with a withdrawal speed being selected dependent on the concentration of said polymer solution, until said substrate material is located in said free volume at a certain distance above said polymer solution, and keeping said substrate material in a vertical position in said free volume, while the solvent evaporates, whereafter said substrate material with said thin film is removed from said container for further drying in a vacuum oven.

2. A method according to claim 1, characterized by the thickness of deposited thin film being regulated for a given concentration of said polymer solution by regulating said withdrawal speed, said thickness increasing with the concentration of said polymer solution and increasing withdrawal speed.

3. A method according to claim 1, characterized by keeping said substrate material in the vertical position at a distance of 1 cm above the surface of said polymer solution.

4. A method according to claim 1, characterized by keeping said substrate material in said vertical position for a time period, the duration of which being selected dependent on the thickness of said thin film and the solvent concentration in said free volume.

5. A method according to claim 4, characterized by said substrate material with the deposited thin film being kept said the vertical position for 20–30 minutes.

* * * * *